(12) United States Patent
Koo et al.

(10) Patent No.: US 10,627,448 B2
(45) Date of Patent: Apr. 21, 2020

(54) APPARATUS AND METHOD FOR DETECTING BATTERY CELL FAILURE DUE TO UNKNOWN DISCHARGE CURRENT

(71) Applicant: LG CHEM, LTD., Seoul (KR)

(72) Inventors: Jin Sam Koo, Cheongju-Si (KR);
Kwang Soo Jeon, Cheongju-Si (KR);
Jun Hyuk Pack, Cheongju-Si (KR);
Dong Hyun Lee, Cheongju-Si (KR);
Kyoung Min Kwon, Sejong (KR);
Jong Hwa Lee, Daegu (KR)

(73) Assignee: LG CHEM, LTD., Seoul (KR)

( * ) Notice: Subject to any disclaimer, the term of this patent is extended or adjusted under 35 U.S.C. 154(b) by 148 days.

(21) Appl. No.: 15/578,178

(22) PCT Filed: Nov. 23, 2016

(86) PCT No.: PCT/KR2016/013550
§ 371 (c)(1),
(2) Date: Nov. 29, 2017

(87) PCT Pub. No.: WO2017/095066
PCT Pub. Date: Jun. 8, 2017

(65) Prior Publication Data
US 2018/0149701 A1    May 31, 2018

(30) Foreign Application Priority Data
Nov. 30, 2015    (KR) .................. 10-2015-0168342

(51) Int. Cl.
*G01R 31/36*    (2020.01)
*G01R 31/385*    (2019.01)
(Continued)

(52) U.S. Cl.
CPC ....... *G01R 31/36* (2013.01); *G01R 19/16542* (2013.01); *G01R 31/3648* (2013.01);
(Continued)

(58) Field of Classification Search
USPC .................. 324/426–430; 320/156
See application file for complete search history.

(56) References Cited

U.S. PATENT DOCUMENTS

| | | | | |
|---|---|---|---|---|
| 4,396,880 A | * | 8/1983 | Windebank | ........... H01M 10/44 320/156 |
| 2009/0218990 A1 | | 9/2009 | Johnson et al. | |

(Continued)

FOREIGN PATENT DOCUMENTS

| | | |
|---|---|---|
| CN | 1543698 A | 11/2004 |
| CN | 101123357 A | 2/2008 |

(Continued)

OTHER PUBLICATIONS

Extended European Search Report, dated Aug. 7, 2018, for European Application No. 16870962.4.
(Continued)

*Primary Examiner* — Vincent Q Nguyen
(74) *Attorney, Agent, or Firm* — Birch, Stewart, Kolasch & Birch, LLP (57) ABSTRACT

A method for detecting failure of a battery cell due to an unknown discharge current, including connecting a detector in series between the battery cell and a power supply for supplying a charging power, determining whether the charging of the battery cell progresses by the charging power in excess of a predetermined battery cell specific charging reference time, measuring a current value of the battery cell in real time if the charging of the battery cell progresses in excess of the battery cell specific charging reference time, determining whether the current value of the battery cell measured in real time exceeds a predetermined battery cell specific failure determination reference current range value, and determining a state of the battery cell as a failure state if the current value of the battery cell exceeds the predeter- (Continued)

mined battery cell specific failure determination reference current range value.

3 Claims, 6 Drawing Sheets

(51) Int. Cl.
  *G01R 19/165* (2006.01)
  *H02J 7/00* (2006.01)
  *G01R 31/50* (2020.01)

(52) U.S. Cl.
  CPC ........ *G01R 31/385* (2019.01); *G01R 31/3646* (2019.01); *G01R 31/3865* (2019.01); *G01R 31/50* (2020.01); *H02J 7/0029* (2013.01)

(56) References Cited

U.S. PATENT DOCUMENTS

| | | |
|---|---|---|
| 2011/0298417 A1 | 12/2011 | Stewart et al. |
| 2012/0182021 A1 | 7/2012 | McCoy et al. |
| 2014/0266229 A1 | 9/2014 | McCoy |

FOREIGN PATENT DOCUMENTS

| | | |
|---|---|---|
| CN | 102012487 A | 4/2011 |
| CN | 102736034 A | 10/2012 |
| EP | 1 067 654 A1 | 10/2001 |
| JP | 3317184 B2 | 8/2002 |
| JP | 3506097 B2 | 12/2004 |
| JP | 3649903 B2 | 5/2005 |
| JP | 2001-228225 A | 2/2008 |
| JP | 2008-43027 A | 2/2008 |
| JP | 2010-8097 A | 1/2010 |
| JP | 2012-3863 A | 1/2012 |
| JP | 2012-237660 A | 12/2012 |
| JP | 2013-37829 A | 2/2013 |
| JP | 2013-84508 A | 5/2013 |
| JP | 2013-254586 A | 12/2013 |
| KR | 10-0391421 B1 | 7/2003 |
| KR | 10-2012-0072459 A | 7/2012 |
| KR | 10-1215037 B1 | 12/2012 |
| KR | 10-2013-0125019 A | 11/2013 |

OTHER PUBLICATIONS

International Search Report for PCT/KR2016/013550 (PCT/ISA/210) dated Feb. 23, 2017.

* cited by examiner

APPARATUS AND METHOD FOR DETECTING BATTERY CELL FAILURE DUE TO UNKNOWN DISCHARGE CURRENT

TECHNICAL FIELD

The present invention relates to an apparatus and method for detecting failure of a battery cell due to an unknown discharge current, and more particularly to an apparatus and method for detecting failure of a battery cell due to an unknown discharge current, which can reduce the time required for failure detection compared to a conventional battery cell failure detection technique by using a real-time current monitoring method.

BACKGROUND ART

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. In addition, the usage range of the lithium ion battery extends as a power source for electric vehicles, so that the lithium ion battery attracts attention as a next generation energy storage medium.

Meanwhile, in the battery cell production process, an unknown discharge current that may occur in a manufactured battery cell is a type of failure that abnormally drops the voltage of the battery cell. The conventional technology for detecting the failure of a battery cell based on the voltage characteristic of the battery cell takes a long period of time from the completion of the production of the battery cell to the time point when the failure is detected so that the production rate of the battery cell is lowered.

Accordingly, the development of a new battery cell failure detection technique using an unknown discharge current, which can reduce the detection time compared to a conventional failure detection technique of a battery cell based on the voltage characteristic of a battery cell in order to increase the production speed of the battery cell, is required.

DISCLOSURE

Technical Problem

The present invention provides a new apparatus and method for detecting failure of a battery cell due to an unknown discharge current, which can reduce the detection time compared to a conventional battery cell failure detection method using an unknown discharge current.

Technical Solution

In accordance with an exemplary embodiment, provided is a method for detecting failure of a battery cell due to an unknown discharge current. The method includes: a detector connection operation of connecting a detector in series between the battery cell and a power supply for supplying a charging power; a test proper charging time determination operation of determining whether the charging of the battery cell progresses by the charging power in excess of a predetermined battery cell specific charging reference time; a current real-time measurement operation of measuring a current value of the battery cell in real time if the charging of the battery cell progresses in excess of the battery cell specific charging reference time; an unknown discharge current monitoring operation of determining whether the current value of the battery cell measured in real time exceeds a predetermined battery cell specific failure determination reference current range value; and a failure detection completion operation of determining a state of the battery cell as a failure state in which an unknown discharge occurs if the current value of the battery cell exceeds the predetermined battery cell specific failure determination reference current range value.

The failure detection completion operation may further include a failure detection notification operation of expressing the failure state through at least one of a speaker, a display unit, and a lamp.

In accordance with another exemplary embodiment, provided is a method for detecting failure of a battery cell due to an unknown discharge current, and the method includes: a detector connection operation of connecting a detector in series between the battery cell and a power supply for supplying a charging power; a test proper charging time determination operation of determining whether the charging of the battery cell progresses by the charging power in excess of a predetermined battery cell specific charging reference time; a current real-time measurement operation of measuring a current value of the battery cell in real time if the charging of the battery cell progresses in excess of the battery cell specific charging reference time; a battery cell current accumulation storage operation of accumulating and storing the real-time measured current value of the battery cell in a storage element for each measured time; a current slope variation calculation operation of calculating a current slope variation of the current value of the battery cell accumulated and stored in the battery cell accumulation storage operation; an unknown discharge current monitoring operation of determining whether the current slope variation calculated in the current slope variation calculation operation exceeds a predetermined battery cell specific failure determination reference current slope variation value; and a failure detection completion operation of determining a state of the battery cell as a failure state in which an unknown discharge occurs if the current slope variation value exceeds the predetermined battery cell specific failure determination reference current slope variation value.

The failure detection completion operation may further include a failure detection notification operation of expressing the failure state through at least one of a speaker, a display unit, and a lamp.

In accordance with another exemplary embodiment, provided is an apparatus, which is connected in series between the battery cell and a power supply for supplying a charging power, for detecting failure of a battery cell due to an unknown discharge current, and the apparatus includes: a storage element configured to store a battery cell specific failure determination reference current range value and a battery cell specific charging reference time in advance; a current measurement unit configured to measure a real-time current from the battery cell; and a control unit configured to determine whether the charging of the battery cell progresses by the charging power in excess of the battery cell specific charging reference time, determine whether the current value of the battery cell measured in real time in the current measurement unit exceeds the battery cell specific failure determination reference current range value if the charging of the battery cell progresses in excess of the battery cell specific charging reference time, and determine a state of the battery cell as a failure state in which an unknown discharge occurs if the current value of the battery cell exceeds the battery cell specific failure determination reference current range value.

The control unit may further include: a test proper charging time determination unit configured to determine whether the charging of the battery cell progresses in excess of the battery cell specific charging reference time; and a failure determination unit configured to determine whether the current value of the battery cell measured in real time exceeds the battery cell specific failure determination reference current range value if the charging of the battery cell progresses in excess of the battery cell specific charging reference time.

The apparatus may further include at least one of a speaker, a display unit, and a lamp, wherein the control unit may further include a failure detection notification unit configured to express the failure state of the battery cell through at least one of the speaker, the display unit, and the lamp.

In accordance with another exemplary embodiment, provided is an apparatus, which is connected in series between the battery cell and a power supply for supplying charging power, for detecting failure of a battery cell due to an unknown discharge current, and the apparatus includes: a storage element configured to store a battery cell specific failure determination reference current variation value and a battery cell specific charging reference time in advance; a current measurement unit configured to measure a real-time current from the battery cell; and a control unit configured to determine whether the charging of the battery cell progresses in excess of the battery cell specific charging reference time by the charging power, accumulate and store the current value of the battery cell measured in real time in the current measurement unit in the storage element for each measure time, calculate a current slope variation of the accumulated and stored current value of the battery cell, determine whether the calculated current slope variation exceeds the battery cell specific failure determination reference current variation value, and determine a state of the battery cell as a failure state in which an un unknown discharge failure occurs if the current slope variation value exceeds a predetermined battery cell specific failure determination reference current slope variation value.

The control unit may further include: a test proper charging time determination unit configured to determine whether the charging of the battery cell progresses in excess of the battery cell specific charging reference time; and a battery cell current accumulation storage unit configured to accumulate and store a current value of the battery cell measured in real time in the current measurement unit in the storage element for each measured time if the charging of the battery cell progresses in excess of the battery cell specific charging reference time; a current slope variation calculation unit configured to calculate the current slope variation from the accumulated and stored current value of the battery cell; and a current slope determination unit configured to determine whether the calculated current slope variation exceeds the battery cell specific failure determination reference current variation value, and determine a state of the battery cell as a failure state in which an unknown discharge failure occurs if the current slope variation value exceeds a predetermined battery cell specific failure determination reference current slope variation value.

The apparatus may further include at least one of a speaker, a display unit, and a lamp, wherein the control unit may further include a failure detection notification unit configured to express the failure state of the battery cell through at least one of the speaker, the display unit, and the lamp.

Advantageous Effects

An apparatus and method for detecting a battery cell failure due to an unknown discharge current according to embodiments of the present invention include monitoring the current of a battery cell in real time and diagnosing the failure of the battery cell due to an unknown discharge current from the current of the monitored battery cell, in detecting the failure of the battery cell due to an unknown discharge current, so it is possible to shorten the time required for a conventional technique to detect the failure of the battery cell due an unknown discharge current in order to shorten the production time of the final battery cell.

In addition, an apparatus and method for detecting a battery cell failure due to an unknown discharge current according to embodiments of the present invention can detect a failure occurrence time of a battery cell due to an unknown discharge current, so that the failure detection can be performed immediately when the failure occurs.

MODE FOR INVENTION

Hereinafter, embodiments of the present invention will be described in detail with reference to the accompanying drawings. However, the present invention may be embodied in different forms and should not be construed as limited to the embodiments set forth herein, and rather, these embodiments are provided so that this disclosure will be thorough and complete, and will fully convey the scope of the present invention to those skilled in the art.

A battery cell according to an embodiment of the present invention may store electrical energy and provide stored electrical energy. Here, the type of a battery cell is not particularly limited. For example, the type of the battery cell may include a lithium ion battery, a lithium polymer battery, a nickel cadmium battery, a nickel hydride battery, a nickel zinc battery, and the like.

First, in order to help understanding an apparatus and method for detecting a battery cell failure due to an unknown discharge current according to embodiments of the present invention, a failure detection technique of a battery cell due to a conventional unknown discharge current will be described with reference to FIG. 1.

1. Conventional Failure Detection Technique of Battery Cell Based on Voltage Characteristics of Battery Cell FIG. 1 is an exemplary view illustrating voltage characteristics of a normal battery cell and a defective battery cell.

Figure 1:
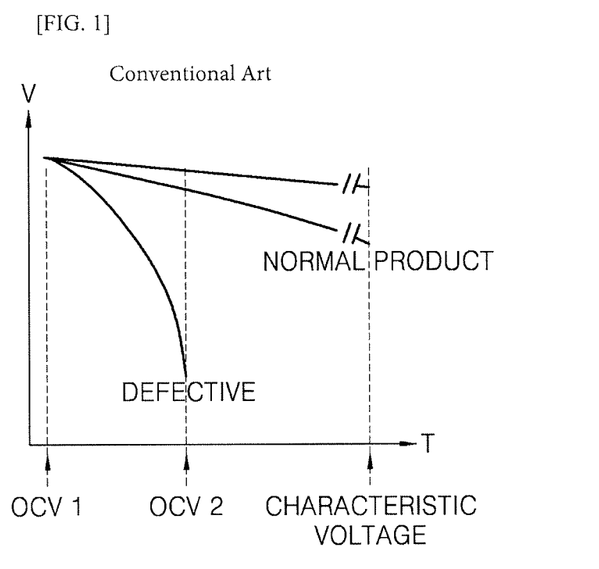
FIG. 1 is an exemplary view illustrating voltage characteristics of a normal battery cell and a defective battery cell.

Referring to FIG. 1, a voltage characteristic of a battery cell in a defective state is sharply decreased over time as compared with a voltage characteristic of a battery cell in a normal state. A conventional battery cell failure detection technique based on such voltage characteristics performs the failure detection of a battery cell through following processes.

Operation of charging a produced battery cell for a predetermined time.

Operation of measuring the voltage of the charged battery cell once.

Operation of re-measuring the voltage of the battery cell several days after the one time measurement.

Operation of determining whether a voltage difference between the initially measured voltage and the re-measured voltage has a value equal to or greater than a predetermined defective battery cell determination reference value.

A failure detection operation of determining that an unknown discharge current failure occurs in the battery cell when the voltage difference has a value equal to or larger than a predetermined defective battery cell determination reference value.

The conventional battery cell failure detection technology based on the voltage characteristics of a conventional battery cell, which is performed in the above operations, has a problem in that it takes several days to detect the failure due to the unknown discharge current of the produced battery cell.

In addition, since the conventional defective detection technology of a battery cell based on the voltage characteristic of a conventional battery cell is applied and the time required for the defective inspection up to the production of a good battery cell is included, this causes the production unit price to rise.

On the other hand, since an apparatus and method for detecting a battery cell failure due to an unknown discharge current according to embodiments of the present invention are based on the current characteristics of a battery cell due to an unknown discharge current, it is possible to reduce the time required for detecting the failure of a battery cell.

2. Apparatus for Detecting Failure of Battery Cell Due to Unknown Discharge Current According to Embodiment of Present Invention FIG. 2 is an example view illustrating an apparatus for detecting failure of a battery cell due to an unknown discharge current according to an embodiment of the present invention, and FIG. 3 is a detailed configuration view illustrating a detailed configuration of an apparatus for detecting failure of a battery cell due to an unknown discharge current according to an embodiment of the present invention.

Figure 2:
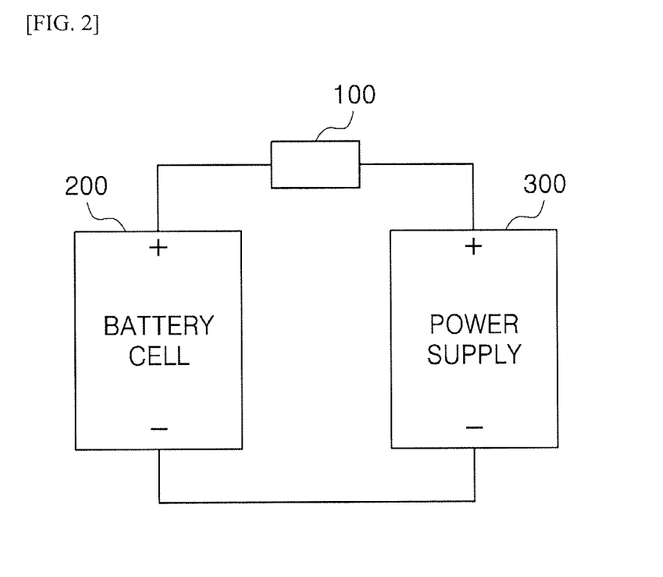
FIG. 2 is an exemplary illustrating an apparatus for detecting failure of a battery cell due to an unknown discharge current according to an embodiment of the present invention.
Figure 3:
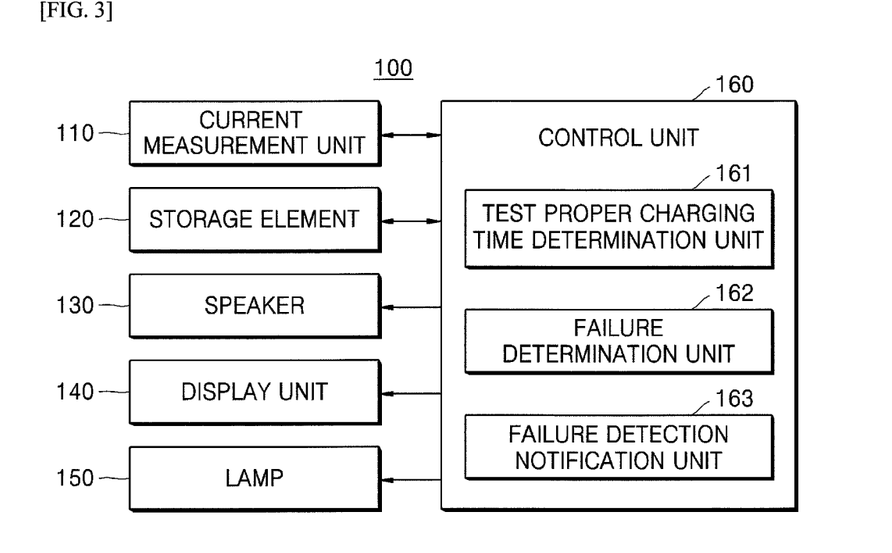
FIG. 3 is a detailed configuration view illustrating a detailed configuration of an apparatus for detecting failure of a battery cell due to an unknown discharge current according to an embodiment of the present invention.

Referring to FIG. 2, the apparatus 100 for detecting failure of a battery cell due to an unknown discharge current according to an embodiment of the present invention includes a battery cell 200 is connected in series between a battery cell 200 and a power supply 300 for supplying a charging power to the battery cell 200, so that it is possible to detect whether the battery cell 200 is in a defective state due to an unknown discharge current.

The battery cell 200 may be charged by the charging power supplied from the power supply 300.

The apparatus 100 for detecting failure of a battery cell due to an unknown discharge current may detect a failure due to an unknown discharge current with respect to the battery cell 200.

Referring to FIG. 3, the apparatus 100 for detecting failure of a battery cell due to an unknown discharge current according to an embodiment of the present invention may be configured including a current measurement unit 110, a storage element 120, and a control unit 160.

The apparatus 100 for detecting failure of a battery cell due to an unknown discharge current according to an embodiment of the present invention may be configured further including at least one of a speaker 130, a display unit 140, and a lamp 150 according to specifications.

The current measurement unit 110 may measure the current of the battery cell 200 in real time according to the control of the control unit 160.

The storage element 120 may store a battery cell specific failure determination reference current range value and a battery cell specific charging reference time according to the control of the control unit 160 in advance. Herein, the battery cell specific charging reference time may include battery cell specific minimum charging time information in order for charging to proceed before the battery cell 200 starts detecting a failure due to the unknown discharge current.

The battery cell specific failure determination reference current range value may include battery cell specific current values of a normal state with respect to a charging time. The battery cell specific failure determination reference current range value may be used as a reference value that is used to determine a failure due to an unknown discharge current.

The control unit 160 may include a test proper charging time determination unit 161, a failure determination unit 162, and a failure detection notification unit 163.

The test proper charging time determination unit 161 may determine whether the charging of the battery cell 200 exceeds the battery cell specific charging reference time stored in advance in the storage element 120 by the charging power of the power supply 300. In order to accurately detect a failure due to an unknown discharge current of the battery cell 200 without error, the charging must be performed in excess of a predetermined charging time for each battery cell.

If the charging of the battery cell 200 proceeds beyond the battery cell specific charging reference time stored in advance in the storage element 120, the failure determination unit 162 may determine whether the current value of the battery cell 200 measured in real time in the current measurement unit 110 exceeds the battery cell specific failure determination reference current range value stored in advance in the storage element 120.

If the current value of the battery cell 200 measured in real time exceeds the battery cell specific failure determination reference current range value stored in advance in the storage element 120, the failure determination unit 162 may determine the state of the battery cell 200 as a failure state in which an unknown discharge occurs.

When the failure determination unit 162 determines the state of the battery cell 200 as a failure state, the failure detection notification unit 163 may express the state of the battery cell 200 as a failure state through at least one of the speaker 130, the display unit 140, and the lamp 150.

3. Method for Detecting Failure of Battery Cell Due to Unknown Discharge Current According to Embodiment of Present Invention FIG. 5 is a flowchart illustrating a method for detecting failure of a battery cell due to an unknown discharge current according to an embodiment of the present invention.

Figure 5:
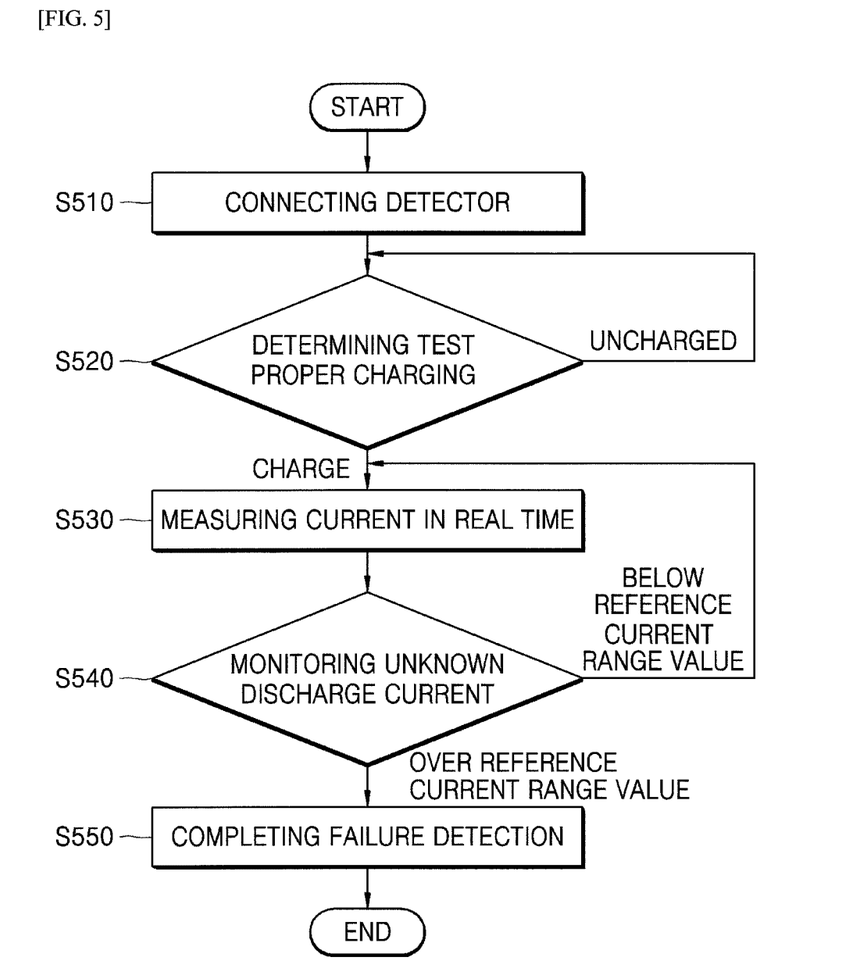
FIG. 5 is a flowchart illustrating a method for detecting failure of a battery cell due to an unknown discharge current according to an embodiment of the present invention.

Referring to FIG. 5, the apparatus 100 for detecting failure of a battery cell due to an unknown discharge current according to an embodiment of the present invention may perform a detector connection operation (S510) to be connected in series between the battery cell 200 and the power supply 300 for supplying a charging power to the battery cell 200.

Thereafter, the control unit 160 of the apparatus 100 for detecting failure of a battery cell due to an unknown discharge current may perform a test proper charging time determination operation (S520) of determining whether the charging of the battery cell 200 proceeds beyond the battery cell specific charging reference time stored in advance in the storage element 120 by the charging power supplied from the power supply 300.

If the charging of the battery cell 200 proceeds beyond the battery cell specific charging reference time stored in advance in the storage element 120, the control unit 160 may perform a current real-time measurement operation (S530) of measuring the current value of the battery cell 200 in real time through the current measurement unit 110.

Thereafter, the control unit 160 may perform an unknown discharge current monitoring operation (S540) of determining whether the current value of the battery cell 200 measured in real time in the current measurement unit 110 exceeds a battery cell specific failure determination reference current range value stored in advance in the storage element 120.

If the current value of the battery cell 200 measured in real time exceeds the battery cell specific failure determination reference current range value stored in advance in the storage element 120, the control unit 160 may perform a failure detection completion operation (S550) of determining the state of the battery cell 200 as a failure state in which an unknown discharge occurs.

In addition, the failure detection completion operation (S550) performed by the control unit 160 may include a failure detection notification operation of expressing a failure state of the battery cell 200 through at least one of the speaker 130, the display unit 140, and the lamp 150.

4. Apparatus for Detecting Failure of Battery Cell Due to Unknown Discharge Current According to Another Embodiment of Present Invention FIG. 4 is a detailed configuration view illustrating a detailed configuration of an apparatus for detecting failure of a battery cell due to an unknown discharge current according to another embodiment of the present invention.

Figure 4:
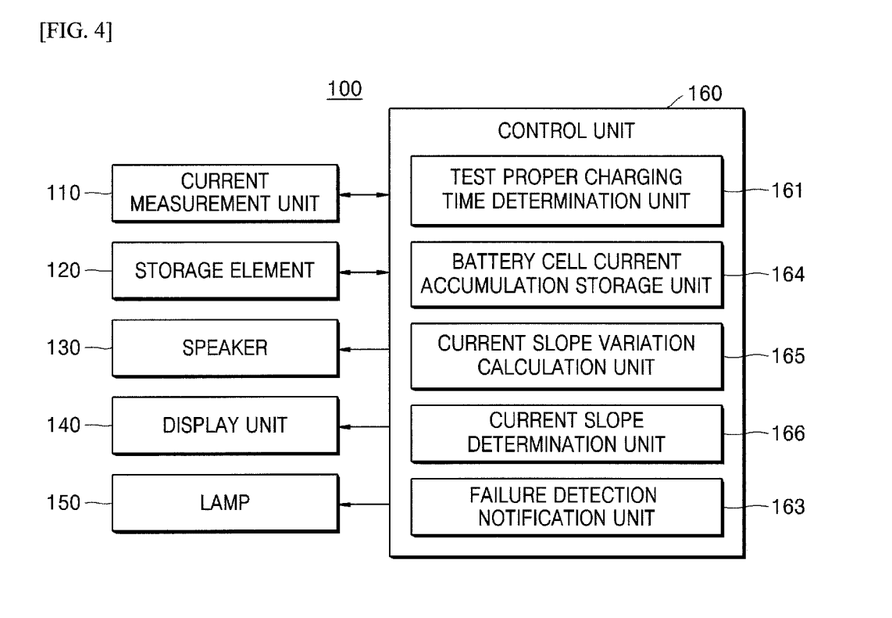
FIG. 4 is a detailed configuration view illustrating a detailed configuration of an apparatus for detecting failure of a battery cell due to an unknown discharge current according to another embodiment of the present invention.

Referring to FIG. 4, an apparatus 100 for detecting failure of a battery cell due to an unknown discharge current according to another embodiment of the present invention may be configured including a current measurement unit 110, a storage element 120, and a control unit 160.

The apparatus 100 for detecting failure of a battery cell due to an unknown discharge current according to another embodiment of the present invention may be configured further including at least one of a speaker 130, a display unit 140, and a lamp 150 according to specifications.

Except for the stored information of the storage element 120 and some configuration of the control unit 160, the apparatus 100 for detecting failure of a battery cell due to an unknown discharge current according to another embodiment of the present invention is identical to the apparatus 100 for detecting failure of a battery cell due to an unknown discharge current according to an embodiment of the present invention, which is described in detail with reference to FIG. 1. Therefore, detailed description of the same components as those of FIG. 1 will be omitted.

The storage element 120 may store a battery cell specific failure determination reference current range variation value and a battery cell specific charging reference time according to the control of the control unit 160 in advance. Herein, the battery cell specific charging reference time may include battery cell specific minimum charging time information in order for charging to proceed before the battery cell 200 starts detecting a failure due to the unknown discharge current. The battery cell specific failure determination reference current range variation value may include battery cell specific current variation values of a normal state with respect to a charging time. The battery cell specific failure determination reference current range variation value may be used as a reference value that is used to determine a failure due to an unknown discharge current.

The control unit 160 may be configured including a test proper charging time determination unit 161, a battery cell current accumulation storage unit 164, a current slope variation calculation unit 165, a current slope determination unit 166, and a failure detection notification unit 163.

The test proper charging time determination unit 161 may determine whether the charging of the battery cell 200 exceeds the battery cell specific charging reference time stored in advance in the storage element 120 by the charging power of the power supply 300. In order to accurately detect a failure due to an unknown discharge current of the battery cell 200 without error, the charging must be performed in excess of a predetermined charging time for each battery cell.

If the charging of the battery cell 200 proceeds beyond the battery cell specific charging reference time stored in advance in the storage element 120, the battery cell current accumulation storage unit 164 may accumulate and store the current value of the battery cell 200, which is measured in real time, in the current measurement unit 110 for each measured time.

Thereafter, the current slope variation calculation unit 165 may calculate the current slope variation from the current value of the battery cell 200 accumulated in the storage element 120 by the battery cell current accumulation storage unit 164.

Thereafter, the current slope determination unit 166 may determine whether the current slope variation calculated by the current slope variation calculation unit 165 exceeds a battery cell failure determination reference current variation value stored in advance in the storage element 120.

Thereafter, if the current slope variation calculated by the current slope variation calculation unit 165 exceeds the battery cell failure determination reference current variation value stored in advance in the storage element 120, the current slope determination unit 166 may determine the state of the battery cell 200 as a failure state in which an unknown discharge failure occurs.

When the current slope determination unit 166 determines the state of the battery cell 200 as a failure state, the failure detection notification unit 163 may express the state of the battery cell 200 as a failure state through at least one of the speaker 130, the display unit 140, and the lamp 150.

5. Method for Detecting Failure of Battery Cell Due to Unknown Discharge Current According to Another Embodiment of Present Invention FIG. 6 is a flowchart illustrating a method for detecting failure of a battery cell due to an unknown discharge current according to another embodiment of the present invention.

Figure 6:
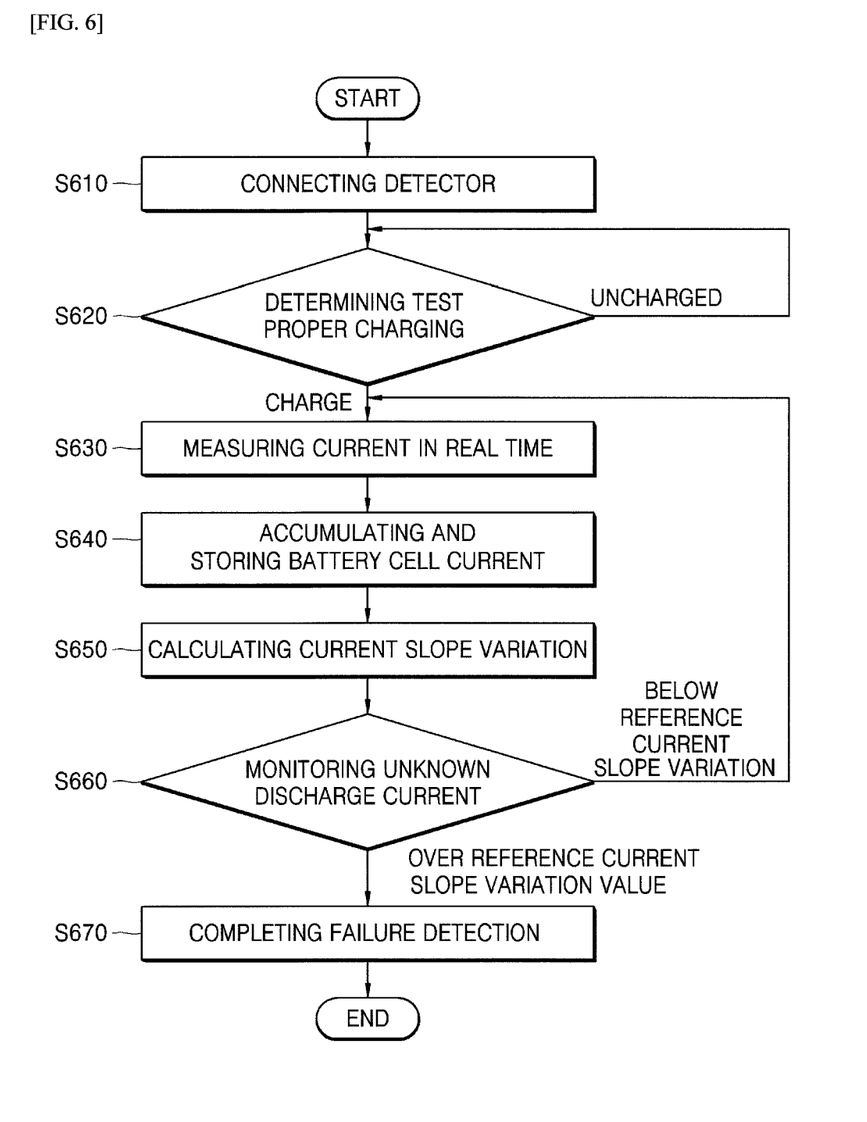
FIG. 6 is a flowchart illustrating a method for detecting failure of a battery cell due to an unknown discharge current according to another embodiment of the present invention.

Referring to FIG. 6, the apparatus 100 for detecting failure of a battery cell due to an unknown discharge current according to another embodiment of the present invention may perform a detector connection operation (S610) to be connected in series between the battery cell 200 and the power supply 300 for supplying a charging power.

Thereafter, the control unit 160 of the apparatus 100 for detecting failure of a battery cell due to an unknown discharge current may perform a test proper charging time determination operation (S620) of determining whether the charging of the battery cell 200 proceeds beyond the battery cell specific charging reference time stored in advance in the storage element 120 by the charging power supplied from the power supply 300.

If the charging of the battery cell 200 proceeds beyond the battery cell specific charging reference time stored in advance in the storage element 120, the control unit 160 may perform a current real-time measurement operation (S630) of measuring the current value of the battery cell 200 in real time through the current measurement unit 110.

Thereafter, the control unit 160 may perform a battery cell current accumulation storage operation (S640) of accumulating and storing the current value of the battery cell 100, which is measured in real time, in the storage element 120 for each measured time.

Thereafter, the control unit 160 may perform a current slope variation calculation operation (S650) of calculating a current slope variation from the current value of the battery cell 200 accumulated and stored in the storage element 120 in the battery cell current accumulation storage operation (S640).

Thereafter, the control unit 160 may perform an unknown discharge current monitoring operation (S660) of determining whether the current slope variation value calculated in the current slope variation calculation operation (S650) exceeds the battery cell specific failure determination reference current slope variation value stored in advance in the storage element 120.

If the calculated current slope variation value exceeds the battery cell specific failure determination reference current slope variation value stored in advance in the storage element 120, the control unit 160 may perform a failure detection completion operation (S670) of determining the state of the battery cell 200 as a failure state in which an unknown discharge occurs.

In addition, the failure detection completion operation (S670) performed by the control unit 160 may include a failure detection notification operation of expressing a failure state of the battery cell 200 through at least one of the speaker 130, the display unit 140, and the lamp 150.

6. Measurement Principle of Unknown Discharge Current According to Embodiments of Present Invention FIG. 7 is an exemplary view illustrating a measurement principle of an unknown discharge current according to embodiments of the present invention.

Figure 7:
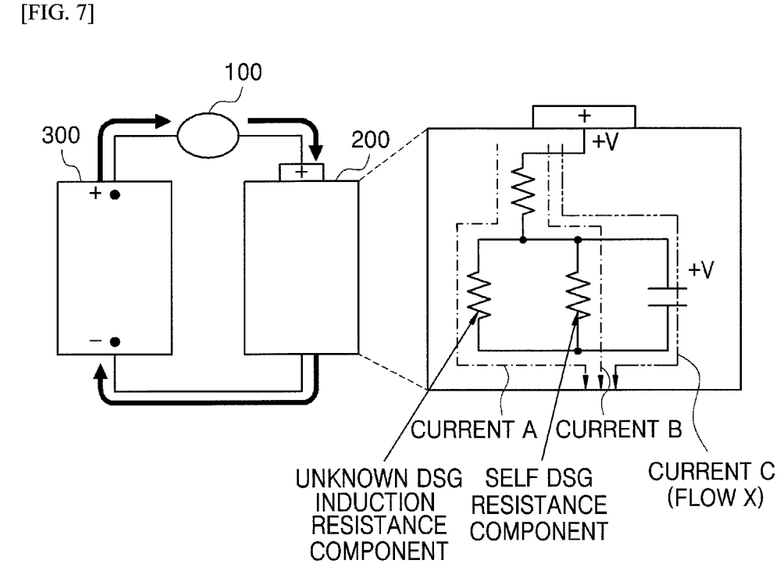
FIG. 7 is an exemplary view illustrating a measurement principle of an unknown discharge current according to embodiments of the present invention.

Referring to FIG. 7, the battery cell 200 may be represented by an equivalent circuit as shown on the right side.

A current A represents the current of the battery cell 200 in a defective state having a resistance component causing an unknown discharge current.

A current B represents the current of the battery cell 200 having a resistance component that induces a basic self-discharge current.

A current C represents the current charged in the battery cell 200 when voltage is applied by the charging power supplied by the power supply 300.

In the normal state of the battery cell 200, only the current B and the current C are applied to the inside of the battery cell 200 by the power supply 300, and the current A does not exist.

Thereafter, as the battery cell 200 in the normal state is charged and becomes a fully charged state, the current C decreases and only the current B exists, so that the total amount of current decreases.

Figure 8:
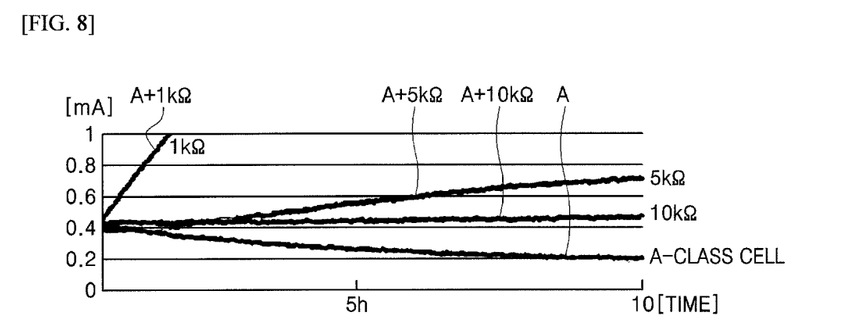
FIG. 8 is an exemplary view illustrating current characteristics of a battery cell in a failure state due to an unknown discharge current and battery cells in a normal state.

More specifically, FIG. 8 is an exemplary view illustrating current characteristics of a battery cell in a failure state due to an unknown discharge current and battery cells in a normal state.

Referring to FIG. 8, in relation to the current characteristic of the A-class cell in the normal state, as the charging progresses and becomes a fully charged state, the total amount of current decreases. In relation to the rest of the cells except the A-class cells, as the charging progresses and becomes a fully charged state, the total amount of current rapidly increases or slowly increases in proportion to the increase amount of the current A.

Figure 9:
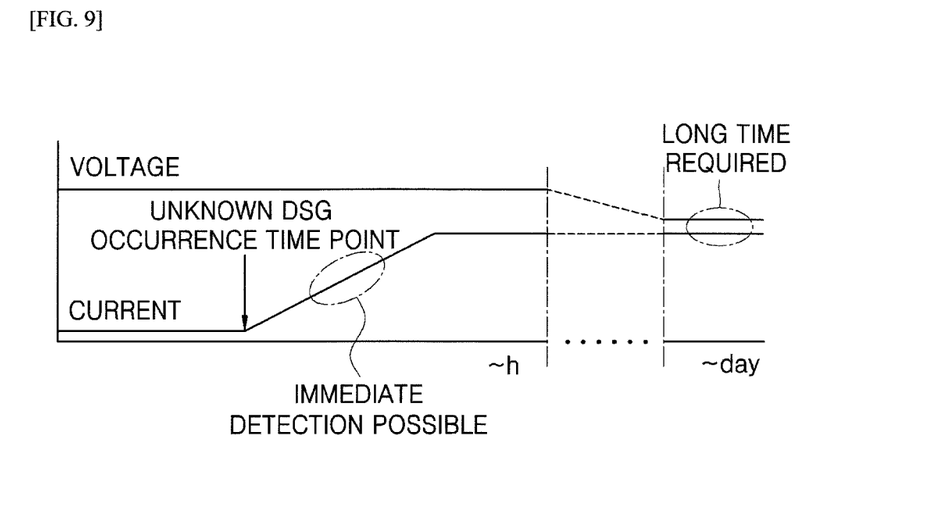
FIG. 9 is an exemplary view illustrating a failure state detection time point of a defective battery cell due to an unknown discharge current according to embodiments of the present invention.

FIG. 9 is an exemplary view illustrating a failure state detection time point of a defective battery cell due to an unknown discharge current according to embodiments of the present invention.

Referring to FIG. 9, the apparatus 100 for detecting failure of a battery cell due to an unknown discharge current according to embodiments of the present invention may immediately detect it immediately when the total amount of current increases due to an unknown discharge current in the battery cell 200 being charged by using the current characteristics of the battery cell 200 described with reference to FIGS. 8 and 9. Therefore, it is possible to reduce the time required for failure detection as compared with the conventional battery cell failure detection technique based on voltage characteristics.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations can be made in the present invention without departing from the spirit and scope of the invention.

What is claimed is:

1. An apparatus, which is connected in series between the battery cell and a power supply for supplying charging power, for detecting failure of a battery cell due to an unknown discharge current, the apparatus comprising:
   a storage element configured to store a battery cell specific failure determination reference current variation value and a battery cell specific charging reference time in advance;

a current measurement unit configured to measure a real-time current from the battery cell; and a control unit configured to:

determine whether the charging of the battery cell progresses in excess of the battery cell specific charging reference time by the charging power, then accumulate and store the current value of the battery cell measured in real time in the current measurement unit in the storage element, then calculate a current slope variation of the accumulated and stored current value of the battery cell, then determine whether the calculated current slope variation exceeds the battery cell specific failure determination reference current variation value, and then determine a state of the battery cell, including determining the battery cell as a failure state in which an unknown discharge failure occurs when the current slope variation value exceeds a predetermined battery cell specific failure determination reference current slope variation value, wherein the control unit is further configured to determine the state of the battery cell by:

determining as the charging progresses to a fully charged state, whether the current decreases or increases, when the current decreases as the charging progresses, designating the battery cell as normal and continue a production process of the battery cell, and when the current decreases as the charging progresses, designating the battery cell as abnormal and removing the battery cell from the production process.

2. The apparatus of claim 1, wherein the control unit further comprises:

a test proper charging time determination unit configured to determine whether the charging of the battery cell progresses in excess of the battery cell specific charging reference time; and a battery cell current accumulation storage unit configured to accumulate and store a current value of the battery cell measured in real time in the current measurement unit in the storage element for each measured time when the charging of the battery cell progresses in excess of the battery cell specific charging reference time;

a current slope variation calculation unit configured to calculate the current slope variation from the accumulated and stored current value of the battery cell; and a current slope determination unit configured to determine whether the calculated current slope variation exceeds the battery cell specific failure determination reference current variation value, and determine a state of the battery cell as a failure state in which an unknown discharge failure occurs when the current slope variation value exceeds a predetermined battery cell specific failure determination reference current slope variation value.

3. The apparatus of claim 2, further comprising at least one of a speaker, a display unit, and a lamp, wherein the control unit further comprises a failure detection notification unit configured to express the failure state of the battery cell through at least one of the speaker, the display unit, and the lamp.

* * * * *